United States Patent
Anthony et al.

(10) Patent No.: US 7,274,052 B2
(45) Date of Patent: Sep. 25, 2007

(54) CCD CHARGE-SPLITTER ADJUSTMENT BY STATIC CHARGE GRADIENT

(75) Inventors: Michael P. Anthony, Andover, MA (US); Edward Kohler, Waltham, MA (US)

(73) Assignee: Kenet, Inc., Woburn, MA (US)

( * ) Notice: Subject to any disclaimer, the term of this patent is extended or adjusted under 35 U.S.C. 154(b) by 0 days.

(21) Appl. No.: 11/175,975

(22) Filed: Jul. 6, 2005

(65) Prior Publication Data
US 2007/0007555 A1    Jan. 11, 2007

(51) Int. Cl.
*H01L 27/148* (2006.01)
*H01L 29/768* (2006.01)

(52) U.S. Cl. ................................ 257/215; 257/241
(58) Field of Classification Search ................ 257/245, 257/214–241
See application file for complete search history.

(56) References Cited

U.S. PATENT DOCUMENTS

| | | | |
|---|---|---|---|
| 4,099,197 A * | 7/1978 | Ibrahim et al. | 257/236 |
| 4,156,858 A * | 5/1979 | Weckler et al. | 257/239 |
| 4,210,825 A * | 7/1980 | Crochiere et al. | 377/61 |
| 4,317,134 A | 2/1982 | Woo et al. | |
| 4,733,407 A | 3/1988 | Pathuis et al. | |
| 5,132,656 A | 7/1992 | Munroe | |
| 5,402,459 A * | 3/1995 | Hynecek | 257/231 |
| 5,671,252 A | 9/1997 | Kovacs et al. | |
| 5,708,282 A | 1/1998 | Linnenbrink et al. | |
| 7,154,134 B2 * | 12/2006 | Anthony et al. | 257/238 |

OTHER PUBLICATIONS

Bencuya, S., et al., "Dynamic Packet Splitting in Charge Domain Devices," *IEEE Electron Device Letters*, vol. EDL-3, 9: 268-270 (1982).
Bencuya, S., et al.,"Charge Packet Splitting in Charge-Domain Devices," *IEEE Electron Device Letters*, vol. ED-31, 10: 1494-1501 (1984).
Sequin C.H., et al., "A Symmetrically Balanced Linear Differential Charge-Splitting Input for Charge-Coupled Devices," *IEEE Transactions on Electron Devices*, ED-24 (6):746-750, (1977).

* cited by examiner

*Primary Examiner*—Cuong Nguyen
(74) *Attorney, Agent, or Firm*—Hamilton, Brook, Smith & Reynolds, P.C.

(57) ABSTRACT

A charge splitter for separating an incoming charge packet into two outgoing packets while the charge is in a static state, i.e., not while it is flowing down a channel or over a barrier. A splitting gate may have a biasing charge impressed upon it, such as via the application of voltage or current sources to opposite ends thereof, applying a bias to a semiconductor body portion of the gate structure, or by physically separate the splitting gate into multiple sections that each have different applied voltages or currents When discharge barrier gates are operated, different amounts of charge will thus flow to different output storage gates.

10 Claims, 5 Drawing Sheets

CCD CHARGE-SPLITTER ADJUSTMENT BY STATIC CHARGE GRADIENT

BACKGROUND OF THE INVENTION

The present invention relates to charge splitting devices and more particularly to a Charge Coupled Device (CCD) structure in which an incoming charge packet is split into multiple outgoing charge packets as a result of a charge gradient.

Charge Coupled Devices (CCDs) provide a basic function of storing and moving isolated packets of charge. Various operations can be performed on the charge packets. For example, they can be added (merged), split into two or more pieces, conditionally steered, destructively or nondestructively sensed, and the like. These operations make it possible to use CCD based circuits for various discrete time analog signal processing operations, by having signals represented as charge packets.

In the following descriptions, the use of "4-phase" CCD technology, with two general types of gates, is assumed. These two types of gates are so-called "storage gates" and so-called "barrier gates." Storage gates are gates under which charge packets reside during appreciable periods of time. Barrier gates are gates under which charges pass dynamically but are not generally stored. Storage and barrier gates may be constructed in two separate layers of gate material, and can overlap. Alternatively, storage and barrier gates may be constructed in a single layer of gate material without overlap.

A charge splitter is one structure that can be built from storage gates and barrier gates. In a charge splitter, a single incoming charge packet is divided into two outgoing packets. The splitting ratio, that is the ratio of the charge of the two outgoing packets, is typically a fixed design parameter of the structure.

One type of non-adjustable charge splitter uses storage and barrier gates arranged in series. The input charge to be split is first fed to a special type of storage gate, called a "splitting gate" herein. The splitting gate provides a structure in which the incoming charge packet is temporarily stored. The channel underneath the splitting gate is physically divided into two sections at an output portion. Thus, when the stored charge is allowed exit the splitting gate, as the charges spill over one or more outgoing barrier gates, the separation of charges is maintained. Each separated charge is then collected and stored in a separate output storage gate.

With this design, the ratio of the split is fixed by the geometry of the channel underneath the splitting gate. The splitting process depends upon both the initial distribution of charge under the splitting gate, and the charge outflow rate from the splitting gate to the respective output storage gates.

In this approach, the splitting operation occurs dynamically, in the sense that the split occurs when charge is actively moved from one storage gate to another. However, the intended amount of the split is fixed and determined in advance.

Unfortunately, although the splitting ratio is intended to be fixed, it can be subject to variations in implementation. These variations occur for multiple reasons, but may be due to Integrated Circuit (IC) process variations (such as differences in photo masking processes, gate threshold levels and the like) as well as operating conditions (such as supply voltage, temperature, external noise sources, and the like). In this case, even when the desired split is a fixed ratio, such a circuit allows for the use of feedback techniques to obtain a more precise result under a variety of continuously varying operating conditions.

In other instances, it would be desirable to provide for an adjustable splitting ratio, that can be determined while the circuit is operating. This would not only permit correction of a fixed split ratio for process variations, but could also be used to provide a generalized circuit function of splitting a charge based on a variable ratio determined by the value of another input signal.

SUMMARY OF THE INVENTION

It would be desirable to provide for better control over the splitting ratio in a charge splitter. Ideally, the splitting ratio could be dynamically controlled, so that the exact split ratio could be controlled by an input signal. Furthermore, when the splitting ratio becomes large, such that a relatively small amount of charge is expected to follow down one path and a relatively large amount of charge is expected to flow down the other path, effective adjustment of the splitter has heretofore been more difficult to achieve. This is especially true at high clock speeds, and thus an adjustable splitter structure could thus also provide higher operating speed than a comparable non-adjustable splitter.

In accordance with one embodiment of the present invention, a charge gradient is applied across a storage gate, called a "splitting gate" herein. The charge gradient is applied while charge, electrons, under the storage gate in the CCD channel are present and confined in a static state, i.e., while the electrons are being held by the splitting gate. The gradient can be created by applying voltages or currents to the splitting gate in various ways.

Whichever end of the splitting gate has a higher charge will attract a larger fraction of the total electrons resident under the gate. When clock signals are asserted to allow the stored electrons to exit the channel under the splitting gate, the charge distribution on the storage gate results in a bias in the outgoing packets that may flow down a split channel. Splitter ratio adjustment is thus accomplished by adjusting the end to end charge difference across the splitting gate.

For typical processes that are available in silicon, the splitting gate can be formed from moderately-doped polysilicon such that a charge difference can be developed by applying a moderate current flow across the gate. In practical implementations, the gate can be driven by a clock connected to a center portion outside the typical region.

In a similar embodiment, charge distribution on the single splitting gate can be adjusted by applying different bias voltages or different currents to opposite ends or other portions thereof.

In another embodiment of the same concept, the charge distribution is applied across the substrate under the splitting gate. In this case, the area of the substrate having the highest applied charge concentration will attract the greatest number of electrons.

Finally, a segmented splitting gate may be also provided by a structure which has a center segment and two outlying segments. Different voltages can then be applied to the outlying gate segments to split the charge.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
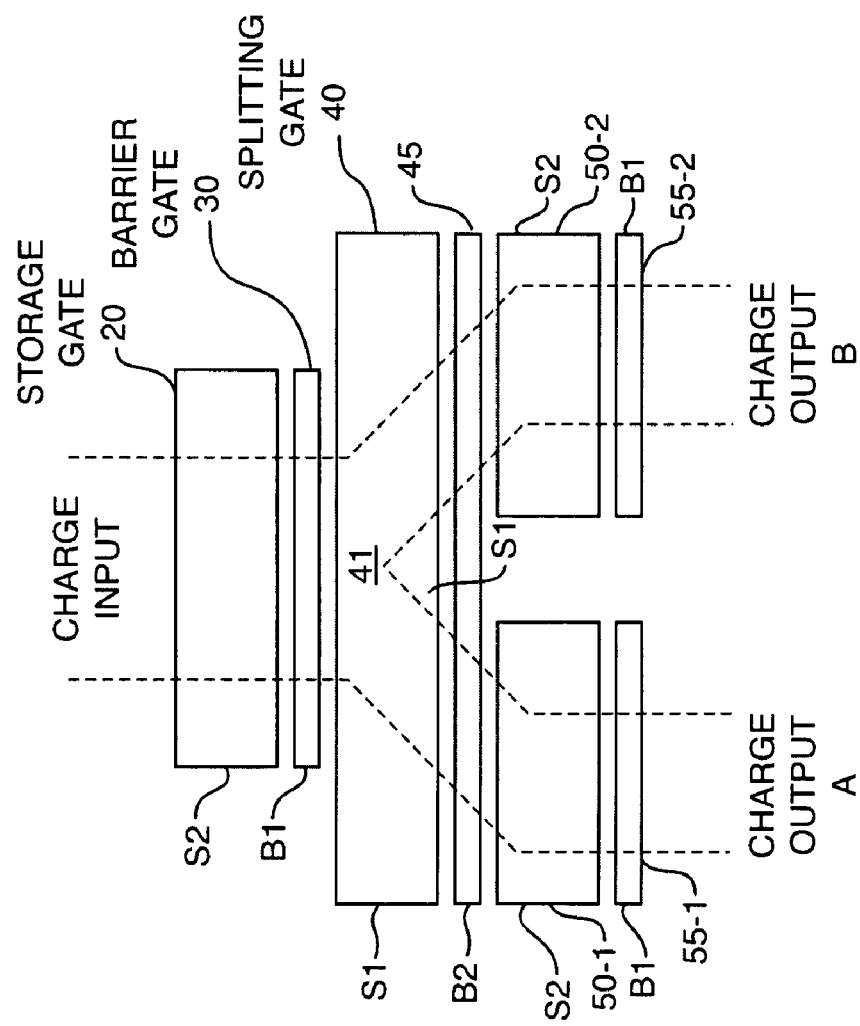
FIG. 1 is a diagram of a prior art charge splitter.

FIG. 1 shows an example of a prior art CCD charge splitter 10. The device is a so called multiple clock phase splitter that passes the input charge through an alternating series of storage and barrier gates. The charge splitter 10 consists of storage gate 20, barrier gate 30, splitting gate 40, barrier gate 45, storage gates 50-1, 50-2 and a corresponding pair of output barrier gates 55-1, 55-2. The illustrated splitter uses at least four clock phases, B1, B2, S1, and S2, although charge splitters can also be implemented in other ways with other types of CCDs, using two or three clock phases. The two clock phases, B1 and B2 drive the barrier gate 30, 45, 55, and the two other clock phases, S1 and S2, drive the storage and splitting gates 20, 40, and 50, as shown.

In operation, charge enters from an input side (at the top of the figure) and is collected by a first storage gate 20. When the barrier gate 30 is enabled, charge spills from storage gate 20 into the splitting gate 40 (which is also serves as a storage gate). The splitting gate 40 uses a physically split channel at 41 to split the stored charge into two output packets, which then exit the splitting gate 40 upon enablement of the output barrier gate 45. In the process of exiting, the split charges pass beneath the barrier gate 45 clocked by a clock phase B2, and end up being stored under separate storage gates 50-1, 50-2 as clocked by phase S2. It should be understood that other configurations are possible—for example, the barrier gate 45 may be implemented as a pair of gates, one associated with the channel "A" output, and the other with the channel "B" output. Similarly, storage gates 50-1, 50-2 and barrier gates 55-1, 55-2 may actually be a single gate of the necessary type, since after point 41 the charges are physically split into separate channels A and B.

With this design, success of the splitting process depends on both the initial distribution of charge under the splitting gate 40 as well as on the outflow rate from the channel under splitting gate 40 into the respective output storage gates 50-1, 50-2.

Figure 2:
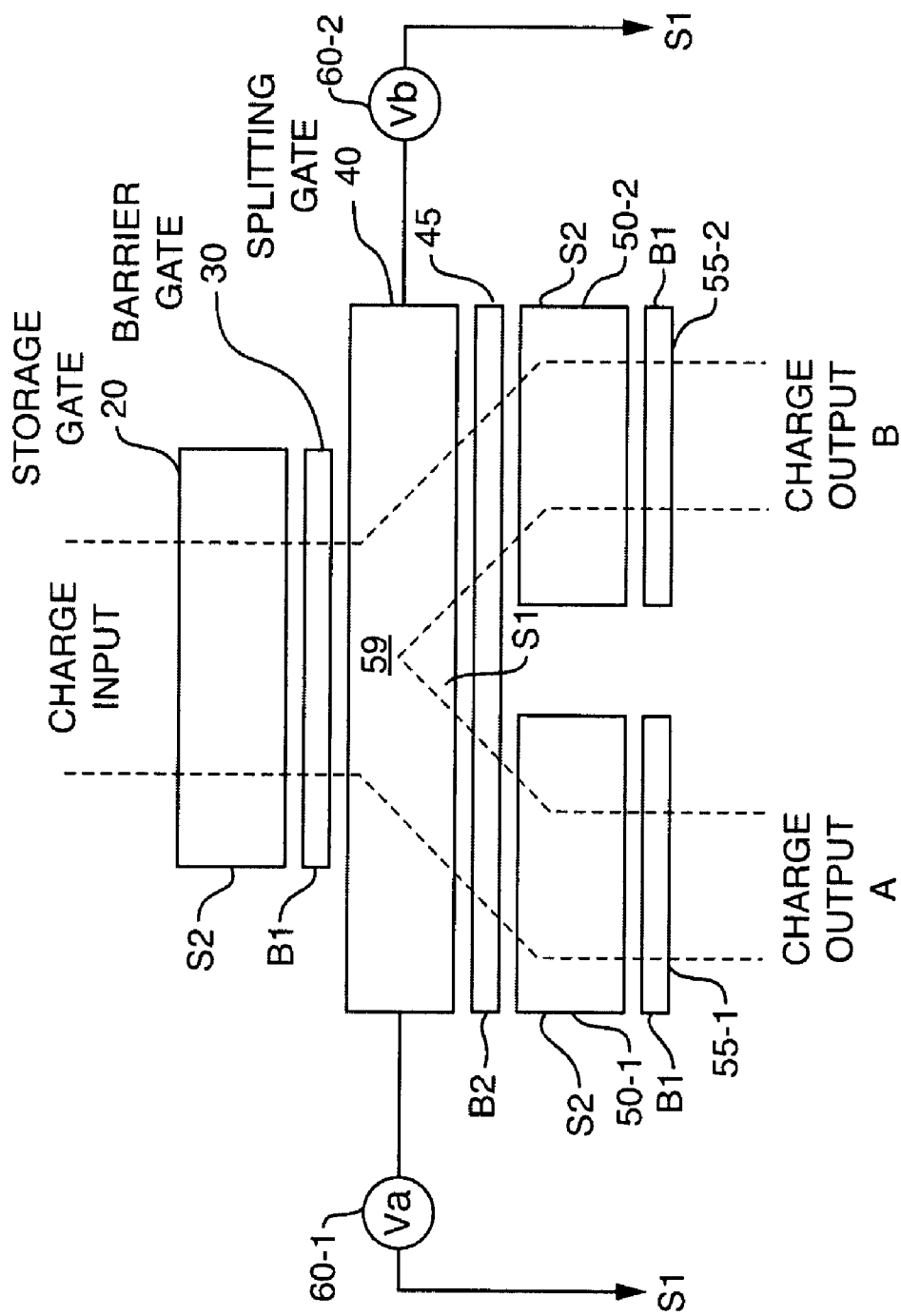
FIG. 2 shows a splitting gate provided by applying a voltage difference across a splitting gate.

FIG. 2 shows one method of adjusting the splitting ratio according to the present invention. In the particular example shown, the splitting gate 40 is still driven by the clock S1, but the gate is also subjected to a charge gradient that is applied to the stored charge therein.

As will be understood shortly, the actual charge splitting is performed while the charge is static. In other words, the charge is not split while it travels over one or more barrier gates 45, but rather while it is being held by the splitting gate 40. Once isolated, the two charge packets are then shifted onto their separate outgoing storage gates 50-1, 50-2 by appropriately clocking the output barrier gates 45-1, 45-2.

One approach for setting up a charge gradient across splitting gate 40, as shown in FIG. 2, is to control one or more the voltages applied to the splitting gate. In this method a a voltage difference is set up across the opposite ends of splitting gate 40. The voltage difference is implemented in one embodiment by applying a first voltage source Va (60-1) to one side of the splitting gate 40 and a second voltage source Vb (60-2) to an opposite side. The side of the splitting gate 40 that has the higher voltage will attract a larger fraction of the total charge resident under the gate 40. Then, when the barrier gate 45 is lowered to allow stored charge to exit the splitting gate 40, the bias in charge distribution on the gate 40 results in a difference in the amount of outgoing charge collected by the respective output storage gates 50-1, 5 0-2. Output storage gates 50-1 and 50-2 will therefore have unequal amounts of charge stored therein.

Figure 3:
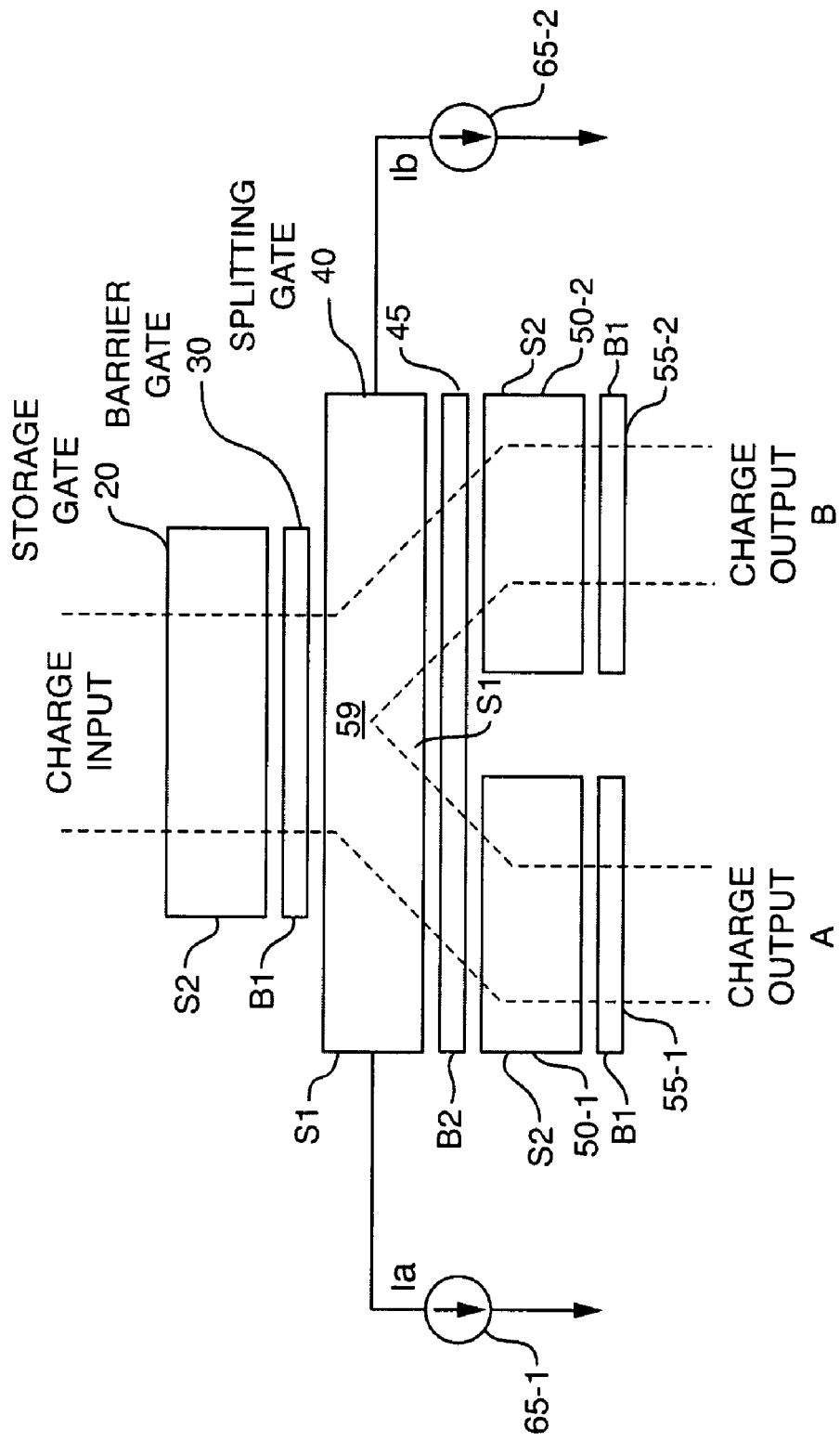
FIG. 3 shows the implementation of FIG. 2 using current sources.

The voltage difference can also be developed by applying a moderate current flow across the splitting gate 40. This implementation is shown in FIG. 3. As a practical matter, the gate 40 can be driven by a clock connected to its center portion 59 (away from the active area).

Two different controllable currents are thus drawn from each outside edge of the gate 40 via the two current sources Ia, Ib. The difference in these two currents develops a voltage difference across the gate 40. With unequal bias current amounts provided by the respective current sources 65-1, 65-2 unequal amounts of charge will thus enter the respective output storage gates 50-1, 50-2.

Figure 4:
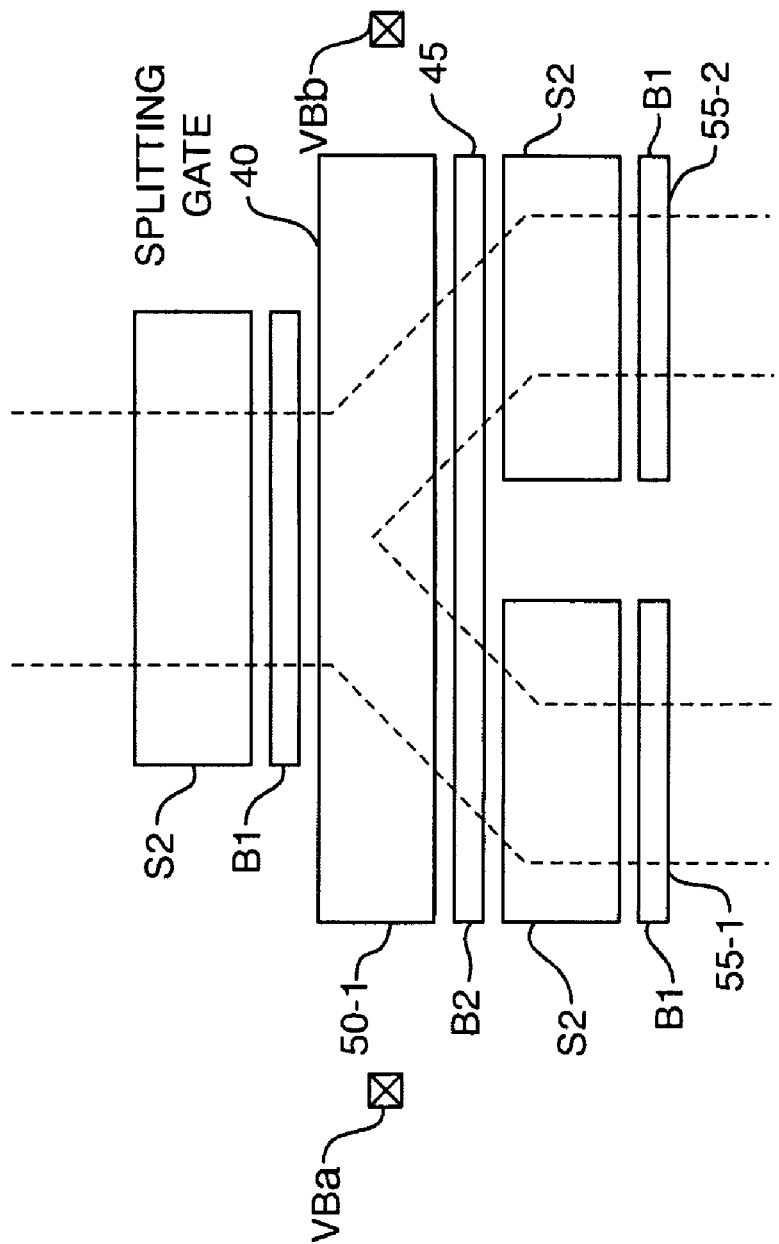
FIG. 4 shows another implementation provided by using differential biasing voltages.

FIG. 4 shows a technique for adjusting the splitting ratio via a differential body voltage. In this method, a voltage difference is applied to the semiconductor body (or "bulk") which underlies the splitting gate 40. Due to the so called "body effect", a body voltage difference similar to a gate voltage difference is developed; a more positive body voltage is similar to a more positive gate voltage. In FIG. 4, the two indicated body contacts are driven by the DC bias voltages, VBa and VBb. Splitter adjustment is therefore accomplished by varying the difference between VBa and VBb. This structure is otherwise quite similar to the structure of FIG. 3.

Figure 5:
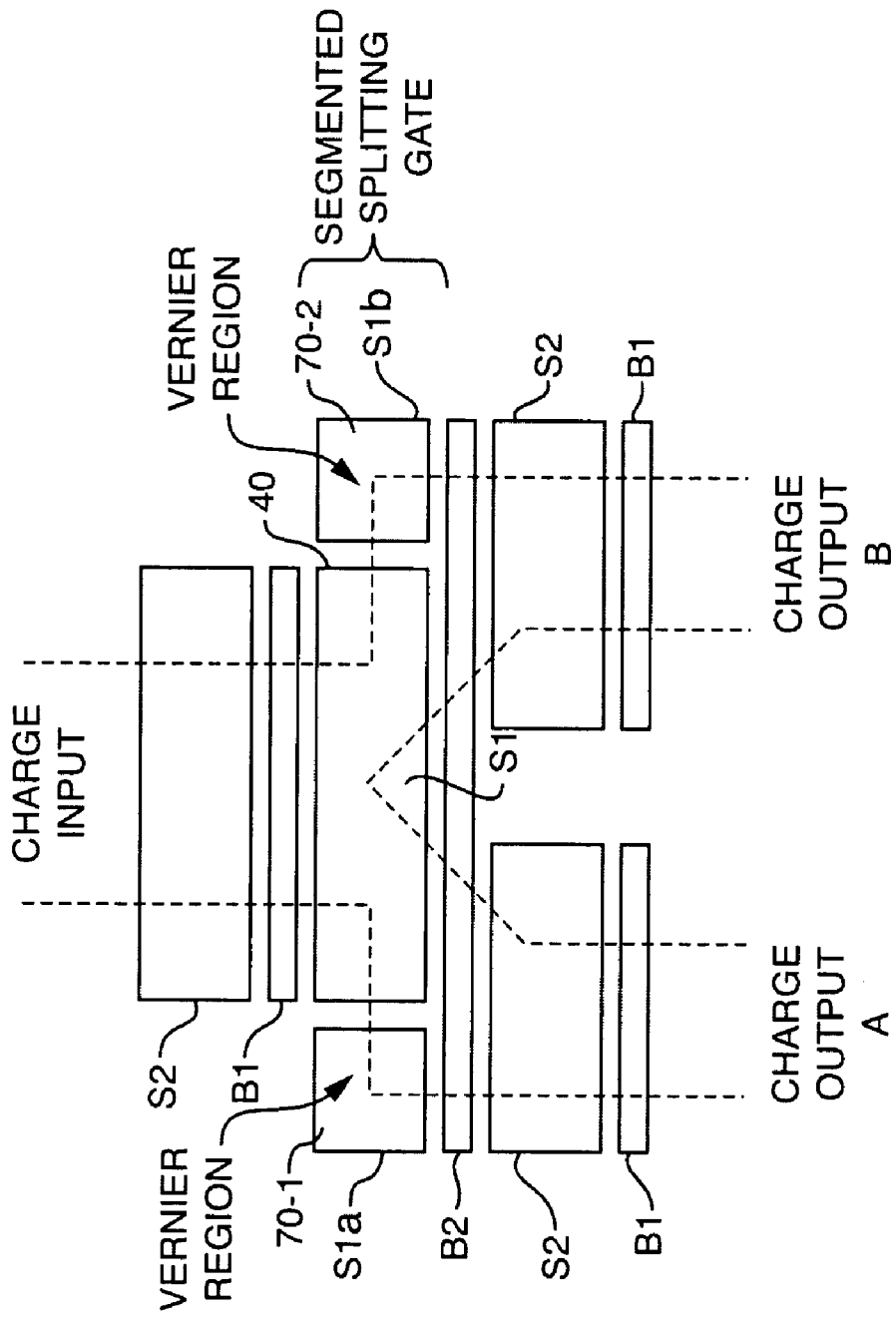
FIG. 5 shows another implementation provided by segmenting the splitting gate.

FIG. 5 shows another technique for adjusting the splitting ratio according to the invention. In this technique, the splitting gate 40 is segmented such that the majority of its area is driven by the principal storage clock S1, quite similar to the embodiment of FIG. 1. However, smaller segments or "vernier" regions 70-1 and 70-2 are formed by separate clocks S1a and S1b. These clocks have an identical phase clock S1 but have a different and adjustable high-state voltages.

Therefore, similar to the approach shown in FIG. 2, whichever adjustable segment 70-1 or 70-2 has the higher voltage will attract a larger fraction of the total charge resident under the composite splitting gate 40. When the charge exits the composite splitting gate 40, this bias in charge distribution results in a bias in the outgoing charge. Splitter adjustment in this approach is thus accomplished by adjusting the high-state voltage difference between the two adjustable vernier regions 70-1, 70-2.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus for splitting an input charge in a charge coupled device comprising:
   a splitting gate, for transferring an input charge, or storing an input charge, according to the state of an applied control clock signal;
   a gradient applicator, for developing a charge gradient across the splitting gate at least while the input charge is stored therein in a static mode; and
   a control signal generator, for applying a clock signal to the splitting gate to operate it between the static mode wherein charge is held therein, and a transfer mode, wherein charge is transferred.

2. An apparatus as in claim 1 wherein the splitting gate is formed of a conductive material over a channel.

3. An apparatus as in claim 2 wherein the channel is split into at least two output channels adjacent the splitting gate.

4. An apparatus as in claim 1 additionally comprising:
   an output barrier gate, arranged to control charge exiting the splitting gate in the transfer mode.

5. An apparatus as in claim 1 additionally comprising:
   an input barrier gate, arranged to control charge entering the splitting gate in the transfer mode.

6. An apparatus as in claim 1 additionally comprising:
   at least two biasing voltage sources, applied to portions of the splitting gate, to develop the charge gradient.

7. An apparatus as in claim 1 additionally comprising:
   at least two biasing current sources, applied to portions of the splitting gate, to develop the charge gradient.

8. An apparatus as in claim 1 additionally comprising:
   at least two voltage sources, connected to a semiconductor body portion of the splitting gate.

9. An apparatus as in claim 1 wherein the splitting gate is formed of two or more sections, each having a high state voltage applied to cause a gradient to be developed across at least one splitting gate section.

10. An apparatus as in claim 9 wherein the splitting gate is formed of three adjacent sections, including a main section and two outlying sections, and the high stage voltage difference is applied to the outlying sections.

* * * * *